TURRET TUNER WITH COAXIAL VERNIER ADJUSTMENT

Filed Aug. 1, 1960

Inventors
Norman D. Cappelle
John J. Kornacker
By Robert L Kahn atty

United States Patent Office 3,069,639
Patented Dec. 18, 1962

3,069,639

TURRET TUNER WITH COAXIAL VERNIER ADJUSTMENT

Norman D. Cappelle, Park Ridge, and John J. Kornacker, Niles, Ill., assignors to Oak Manufacturing Co., Crystal Lake, Ill., a corporation of Delaware Filed Aug. 1, 1960, Ser. No. 46,591
8 Claims. (Cl. 334—57)

This invention relates to television tuning apparatus and more particularly to a mechanism for operating a fine tuning means independently of the means for operating the tuner. The invention is particularly useful for tuners having co-axial means for controlling both the setting of the tuner and the setting of a fine tuning means in conjunction with the tuner.

Television tuners having an operating shaft for controlling the channel setting of a television tuner are well known and in wide use. As a rule, many tuners on television sets have a fine tuning attachment which is adjusted independently of the tuner. Such fine tuning is usually effected by a sleeve disposed around the tuning control shaft.

Where the means for actuating a fine tuning mechanism does not have much friction and where the fine tuning mechanism itself does not present any substantial mechanical load, it has been found that some friction between an operating shaft and a sleeve for operating the fine tuning mechanism creates sufficient drag so that the operation of the tuning shaft will frequently cause undesired operation of the fine tuning sleeve. This invention provides a simple means for preventing mechanical interference between the operating shaft and operating sleeve whereby the operation of one will be independent of the operation of the other. For a more thorough understanding of the invention reference will now be made to the drawing wherein:

Figures 1, 2, 3, 4, 5:
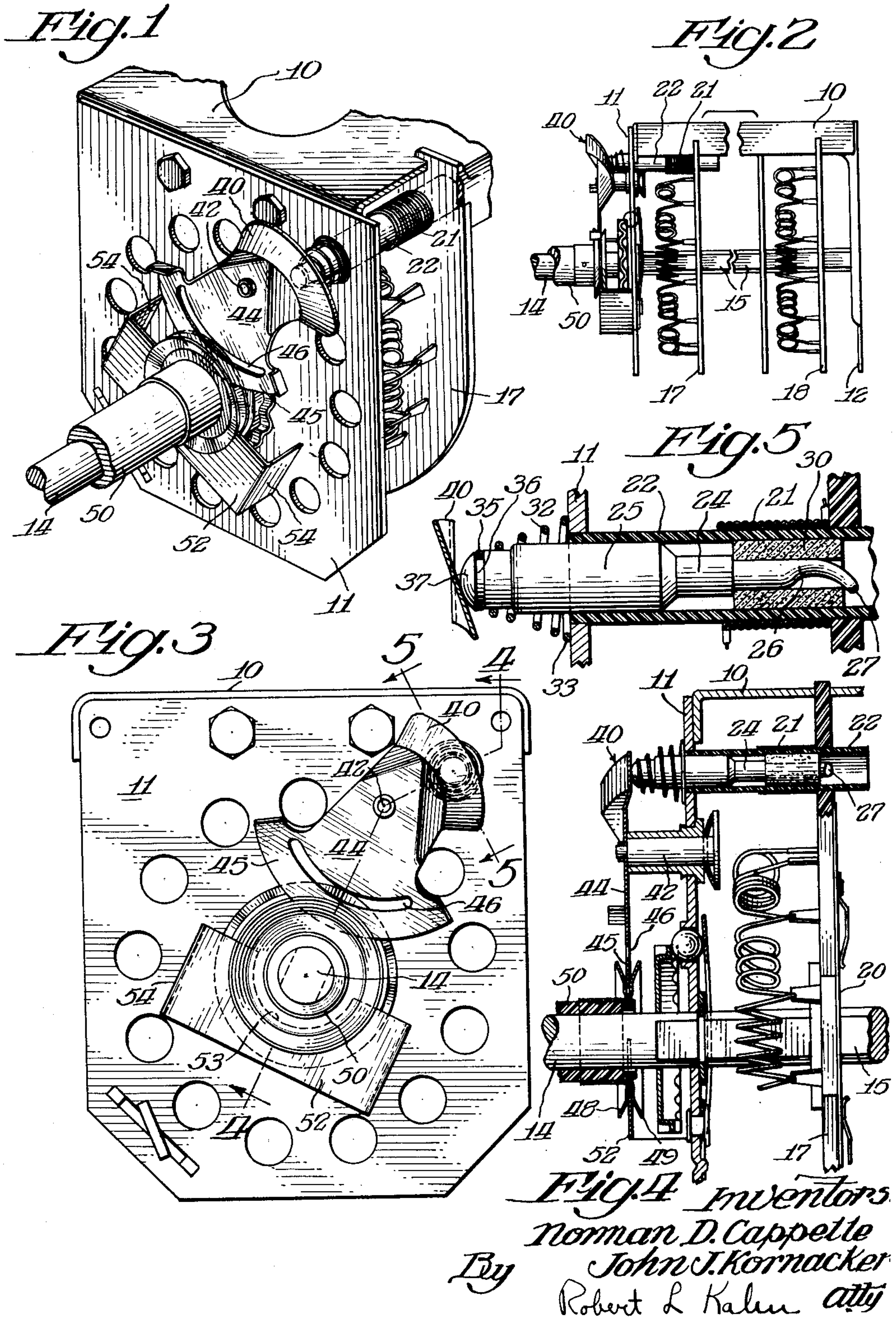
FIGURE 1 is a perspective view of a portion of a tuner having a fine tuning means provided with the improved means embodying the present invention for preventing interference between the tuning shaft and tuning sleeve.
FIGURE 2 is a detail from a side of the tuner illustrated in FIGURE 1.
FIGURE 3 is an enlarged view of the front plate of a tuner house embodying the invention illustrated in FIGURE 1.
FIGURE 4 is an enlarged elevation partly in section and partly broken away illustrating the construction shown in FIGURES 1 to 3 inclusive.
FIGURE 5 is a detail, partly in section, showing details of a fine tuning means.

The television tuner to which this invention may be applied may be of any type. As is well known, television tuners may be of the continuous type, the turret type or the switch type. In the continuous type, the means for accomplishing the tuning is continuously variable throughout the operating range of the tuner so that a gradual change in tuning is effected when the shaft is turned. In the turret type of tuner, a turret head is provided having a plurality of strips, each strip containing wiring and circuit components corresponding to a particular television channel. Such a tuner has suitable contacts for connecting to various strips as the shaft is turned. The switch type has a number of switch sections each containing suitable circuit components. Each switch section has a stator and rotor and tuning is accomplished by turning the shaft and various rotors of various switch sections to change connections. For convenience a tuner of the switch type is illustrated here but it is to be understood that the invention may be applied to other kinds of tuners.

Referring now specifically to the drawings, a tuner has housing 10 provided with front plate 11 and rear plate 12. As a rule, housing 10 provides metal shielding from all sides although the housing is not completely shown in the figures.

Rotatably secured in plates 11 and 12 is operating shaft 14 having operating portion 15 which may be of non-circular cross section for turning the rotors of switch sections. Inasmuch as this type of a tuner is well known and is illustrated, for example, in United States Patent No. 2,801,377, no detailed description is necessary. Such a tuner may have a number of switch sections of which two are illustrated here. These two sections, 17 and 18, consist of stators carrying suitable coils. Each switch section includes rotor 20 carrying suitable contacts for cooperation with stator contacts to switch the various coils into or out of circuit as desired.

Front plate 11 of the tuner housing supports an index means of any suitable construction. As an example, the index mechanism disclosed in United States Patent No. 2,186,949 may be used. Other index means may also be used.

In all tuners, the mechanical load on operating shaft 14 will be sufficient so that a definite effort to turn shaft 14 is required for tuner operation. Thus in a switch type tuner, the switch sections usually provide sufficient friction to create a substantial drag on the shaft. In addition, the index mechanism also provides a substantial load upon the shaft. The same considerations apply to a turret type tuner. In the case of a continuous type tuner, the tuning elements may or may not provide sufficient friction and usually the shaft is loaded with means such as an index mechanism providing an appreciable load. As is well known, a knob or other suitable means is provided on shaft 14 and this knob usually cooperates with some indicating means to show the channel setting.

In addition to the tuner sections proper, a fine tuning means is provided. This fine tuning means may generally consist of a capacitor or an inductor whose value is varied in any fashion. A simple means for varying an inductor may involve a ferromagnetic core, usually of powdered iron, which is moved into or out of a winding. Thus as illustrated here, inductor 21 comprises a winding which may be connected into the intermediate frequency oscillator circuit of a television receiver. As is well known, the oscillator frequency may be varied somewhat so that the intermediate frequency is varied and thus a fine tuning is obtained.

Inductor 21 is disposed on sleeve 22 of non-magnetic and non-metallic insulating material. Thus sleeve 22 may consist of a tube of plastic or paper or any other desired material. Slidably disposed within sleeve 22 is plunger 24 having enlarged piston portion 25 to fit smoothly in sleeve 22. Plunger 24 has reduced portion 26 provided with curved tail 27. Powdered iron core 30 in the form of a sleeve is disposed over portion 26 by forcing it past tail 27. The natural curve of tail 27 maintains the core sleeve in proper position. The entire plunger is preferably of a molded plastic such as nylon. This arrangement is convenient since it facilitates assembly of core sleeve 30 over reduced plunger portion 26 and insures retention of the core sleeve. Furthermore, by having plunger part 24 smaller than piston part 25 but larger than reduced part 26, there will be no binding of the entire plunger in sleeve 22. Sleeve 30 can have some play in sleeve 22 and is loose enough so precision is unnecessary. However, sleeve 30 is tight against the shoulder formed by plunger part 24 so once the sleeve is on, it is firm.

For the inductance of winding 21 to be varied, it is essential that core 30 be moved to a desired position within winding 21. This is conveniently obtained by providing means for biasing plunger 24 to one extreme position, from which position said plunger may be moved. The means for obtaining this bias consists of spiral helical spring 32 having large end 33 of the spring disposed against front plate 11. Spring 32 has small end 35 disposed in annular slot 36 cut in head 37 of plunger 24. Spring 32 may be easily forced into position after the parts are assembled on the tuner. Head 37 of the movable core structure is rounded and provides a cam follower surface for cooperation with cam plate 40. Cam plate 40 is comparatively rigid and is so shaped as to create a force tending to move plunger 25 axially with turning movement of cam plate 40. Cam plate 40 is rotatably secured to pin 42 carried by front plate 11. Any other suitable means for supporting cam plate 40 in position may be provided.

Cam plate 40 is preferably of spring metal such as brass and has cam driving portion 44. Cam driving portion 44 and cam portion 40 are on opposite sides of pivot pin 42. Driving portion 44 has arcuate edge 45 and also has arcuate slot 46 therein. Arcuate slot 46 is provided so that cam driving portion 44 may respond to some lateral deflecting forces perpendicular to the cam plate due to drive irregularities without affecting the relative position of the cam plate and fine tuning plunger 24.

Cam driving portion 44 cooperates with a pair of spring washers 48 and 49 rigidly attached to fine tuning sleeve 50. Spring washers 48 and 49 are of spring metal such as copper or brass and have their edges bent outwardly away from each other. Cam driving portion 44 is caught between the flat portions of washers 48 and 49 to establish a driving connection between sleeve 50 and cam plate 40. This general type of drive with a pair of opposed spring washers is well known and is used in many devices.

As is well known, sleeve 50 has a suitable fine tuning knob attached thereto and rotation of the sleeve by means of the knob will cause turning of cam plate 40 and adjustment of fine tuning plunger 24.

The entire fine tuning construction presents a very light mechanical load, as seen from sleeve 50. Rotation of shaft 14 may react on sleeve 50 to change the fine tuning adjustment. This is avoided by the following means.

Disposed between curved washers 48 and 49 is drag plate 52. Drag plate 52 has arcuate portion 53 disposed between washers 48 and 49. As can be seen in FIGURE 3, drive portion 44 of fine tuning cam plate 40 and drag plate 52 are on opposite sides of the axis of shaft 14. Drag plate 52 is firmly attached to front plate 11 in any desired fashion. Thus drag plate 52 may have portions 54 bent toward front plate 11 and provided with tongues that project through suitable slots in the front plate. Other means for attaching the drag plate to the front plate of the tuner housing or to any other fixed support may be provided.

Drag plate 52 is so designed with regard to arcuate extent, thickness of material and the depth into which the drag plate extends between washers 48 and 49 as to create a substantial drag upon washers 48 and 49. Thus when sleeve 50 is turned, a substantial frictional load will be presented by the drag plate and will make it possible to accurately adjust the fine tuning means as well as prevent accidental disturbance of the fine tuning position in the event that tuning shaft 14 is operated.

While the mechanism has been shown in connection with a television tuner, it may be used for other devices where required.

What is claimed is:

1. A mechanism comprising a shaft, means for rotatably mounting said shaft, a load coupled to said shaft to be operated thereby, a sleeve disposed over said shaft and rotatable with respect thereto, a load normally coupled to said sleeve and having so little friction that said sleeve may turn with said shaft upon shaft movement, and coupling means for said sleeve including a pair of friction washers and a flat stationary member having an arcuate portion disposed between said friction washers and providing a frictional drag on said washers whereby said sleeve will remain stationary upon movement of said shaft.

2. In combination, a television tuner having a shaft rotatably secured for channel selection, a sleeve disposed around said shaft, said sleeve having a substantial bearing surface with respect to said shaft and having some friction therebetween, fine tuning means carried by said tuner, said fine tuning means including a movable plunger, a cam plate rotatably secured to said tuner, said cam plate having a cam surface for cooperation with said movable plunger to adjust the position of said plunger with rotation of said cam plate, said cam plate having an arcuate driving portion, a pair of spring washers secured to said sleeve, said spring washers cooperating with said arcuate driving portion for turning said cam plate with sleeve rotation, said fine tuning means normally providing a sufficiently light load so that rotation of said shaft is likely to cause said sleeve to follow and thus actuate said fine tuning plunger, and stationary means having an arcuate portion disposed between said friction washers for providing a drag upon said fine tuning drive to prevent idler action.

3. The construction according to claim 2 wherein said cam plate is provided with an elongated slot between the arcuate driving portion and the body of said cam plate whereby irregularities in the drive from said sleeve will have negligible effect upon the cam plate proper.

4. The construction according to claim 2 wherein said fine tuning means includes a cylinder in which there is disposed for longitudinal movement a plunger having a rounded head for acting as a cam follower to cooperate with said cam plate and means for biasing said plunger so that the cam follower presses against the cam plate.

5. In a television tuner having a fine tuning means, the combination of a tuner housing, a cam plate rotatably secured to said housing, said cam plate having a cam portion, fine tuning means including a cylinder and a plunger within said cylinder, said plunger having a removable ferromagnetic sleeve disposed over a flexible pin shaped portion, said flexible pin shaped portion terminating in a transversely bent tail portion, said sleeve being maintained in position by forcing the same over said tail, the spring in said tail maintaining said sleeve against accidental removal.

6. The construction according to claim 5 wherein said plunger has a portion projecting beyond said cylinder and a coiled spiral helical spring disposed around said portion, said spiral helix having a small end anchored to said plunger by means of an annular groove therein, said spring having the large end anchored against a fixed object, and means including a pair of friction washers for turning said cam plate to actuate said plunger for changing the setting of said fine tuning means, said plunger portion having a round head, said round head being disposed against said cam plate surface so that said plunger can be moved as said cam plate turns on its axis, said spring means biasing said plunger so that the cam plate is always in contact with the rounded end of said plunger, and a stationary plate having an arcuate edge disposed between said friction washers for imposing a drag to prevent any change in the setting of the fine tuning means upon shaft rotation.

7. In a television tuner, a fine tuning means comprising a non-magnetic, non-metallic cylinder having a winding around the outside of said cylinder, a molded plunger having a portion thereof of reduced diameter as compared to the remainder of the plunger, the junction of said reduced portion and plunger proper providing a shoulder, said reduced plunger portion terminating in a transversely curved tail and a sleeve of material containing metal for altering the inductance of said winding, said sleeve being dimensioned to be slidable over said reduced plunger portion and being maintained snugly against said shoulder by said tail, said tail having sufficient transverse curvature and being sufficiently long so that said sleeve must be forced over said tail with the tail curvature tending to maintain a pressure on the end of said sleeve.

8. The construction according to claim 7 wherein said plunger has the end remote from the tail rounded to provide a head, said plunger head having an annular slot, and a helical spiral spring having the small end in said annular slot and the large end adapted to rest against a support for the end of said cylinder whereby said plunger can be biased to one position and may be adapted to be moved therefrom.

References Cited in the file of this patent

UNITED STATES PATENTS

| | | |
|---|---|---|
| 2,584,120 | Fyler | Feb. 5, 1952 |
| 2,620,378 | Thias | Dec. 2, 1952 |
| 2,821,622 | Thias | Jan. 28, 1958 |
| 2,821,624 | Koch | Jan. 28, 1958 |
| 2,922,881 | Frey | Jan. 26, 1960 |
| 2,947,866 | Valdettaro et al. | Aug. 2, 1960 |